United States Patent [19]
Neilson et al.

[11] Patent Number: 6,080,614
[45] Date of Patent: Jun. 27, 2000

[54] METHOD OF MAKING A MOS-GATED SEMICONDUCTOR DEVICE WITH A SINGLE DIFFUSION

[76] Inventors: John Manning Sauidge Neilson, 2620 Egypt Rd., Norristown, Pa. 19403; Linda Susan Brush, 605 Nuangola Rd., Mountaintop, Pa. 18707; Frank Stensney, 68 Joan Dr., Mountaintop, Pa. 18707; John Lawrence Benjamin, 185 Sutherland Dr., Mountaintop, Pa. 18707; Anup Bhalla, 64 Wross St., Wilkes-Barre, Pa. 18701; Christopher Lawrence Rexer, 225 Fairwood Blvd., Mountaintop, Pa. 18701; Richard Douglas Stokes, 1345 Jackson Rd., Shavertown, Pa. 18708-9766; Christopher Boguslow Kocon, 16 Grace Dr., Plains, Pa. 18705-3501; Louise E. Skurkey, 18 Old Forest Rd., Conyngham, Pa. 18219; Christopher Michael Scarba, 43 W. Market St., Tresckow, Pa. 18254

[21] Appl. No.: 08/885,877

[22] Filed: Jun. 30, 1997

[51] Int. Cl.[7] .......................... H01L 21/425; H01L 21/22; H01L 21/38

[52] U.S. Cl. .......................... 438/238; 438/527; 438/530; 438/547; 148/DIG. 126

[58] Field of Search .................................. 438/238, 527, 438/530, 547; 148/DIG. 126

[56] References Cited

U.S. PATENT DOCUMENTS

| | | |
|---|---|---|
| 5,187,117 | 2/1993 | Zommer . |
| 5,559,045 | 9/1996 | Yamamoto . |
| 5,605,851 | 2/1997 | Palmieri et al. . |
| 5,698,458 | 12/1997 | Hsue et al. . |
| 5,750,429 | 5/1998 | Kushida . |
| 5,817,546 | 10/1998 | Ferla et al. . |

*Primary Examiner*—John F. Niebling
*Assistant Examiner*—J. Jones

[57] ABSTRACT

A method of fabricating a MOS-gated semiconductor device in which arsenic dopant is implanted through a mask to form a first layer, boron dopant is implanted through the mask to form a second layer deeper than the first layer, and in which a single diffusion step diffuses the implanted arsenic and the implanted boron at the same time to form a P+ body region with an N+ source region therein and a P type channel region.

46 Claims, 15 Drawing Sheets

EPITAXIAL STARTING WAFER

OXIDIZE

COAT WITH RESIST, ALIGN TO RING MASK, EXPOSE

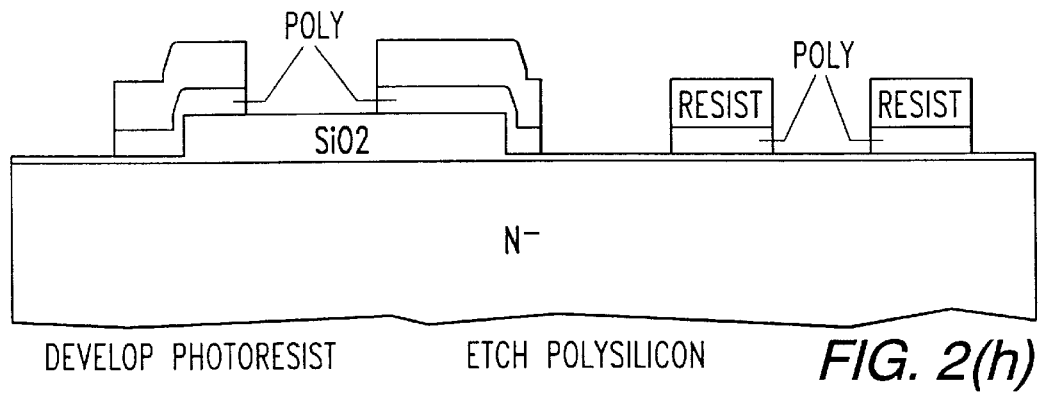
DEVELOP PHOTORESIST   ETCH POLYSILICON   *FIG. 2(h)*
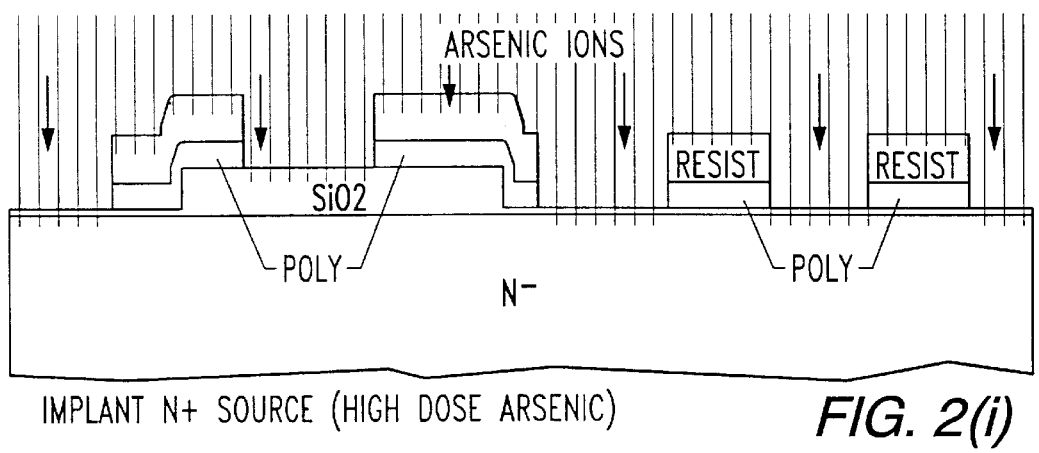
IMPLANT N+ SOURCE (HIGH DOSE ARSENIC)   *FIG. 2(i)*
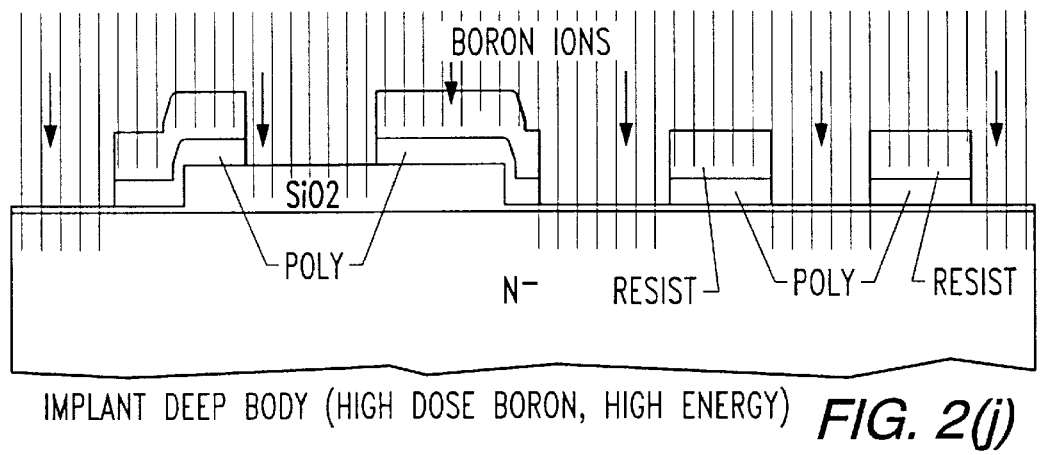
IMPLANT DEEP BODY (HIGH DOSE BORON, HIGH ENERGY)   *FIG. 2(j)*
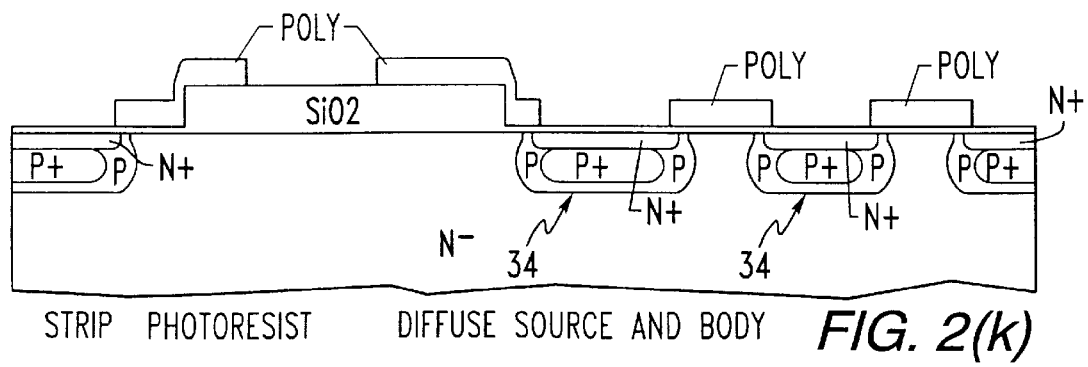
STRIP PHOTORESIST   DIFFUSE SOURCE AND BODY   *FIG. 2(k)*

DEPOSIT & DENSIFY BPSG

COAT WITH RESIST, ALIGN CONTACT MASK TO POLY MASK, EXPOSE

DEVELOP PHOTORESIST    ETCH BPSG    ETCH SILICON

STRIP RESIST    DEPOSIT NITRIDE OVERCOAT
COAT WITH RESIST, ALIGN BONDPAD MASK, EXPOSE

DEVELOP PHOTORESIST    ETCH NITRIDE

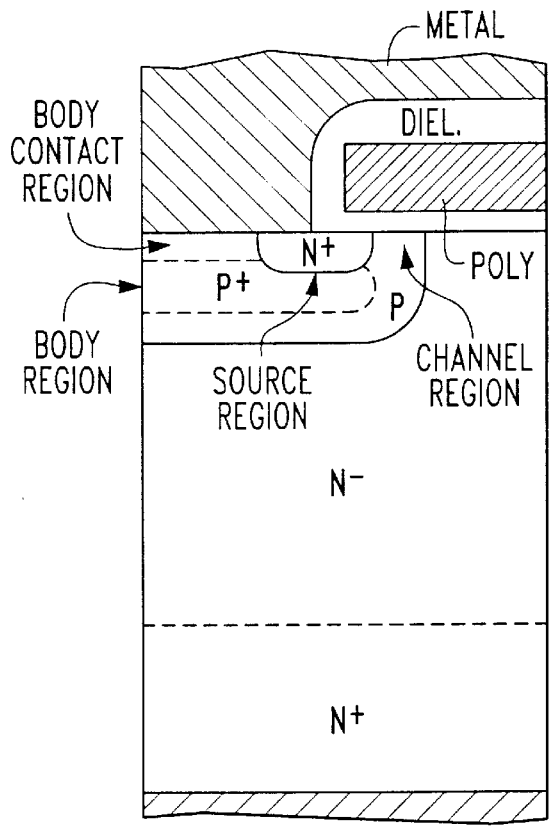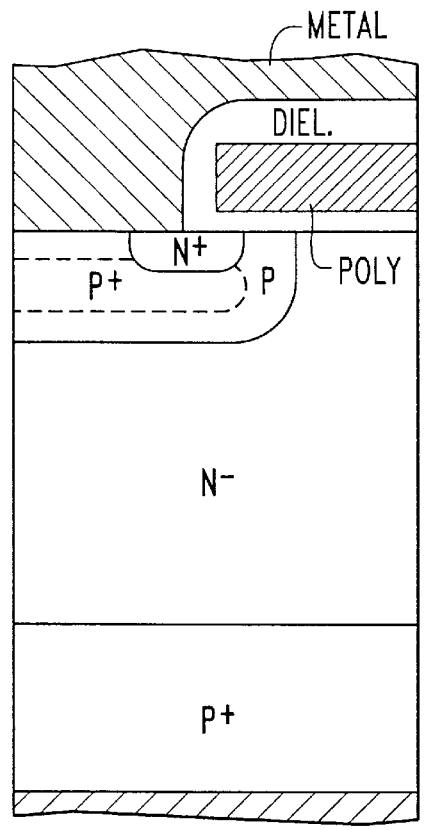
FIG. 3(a)
FIG. 3(b)
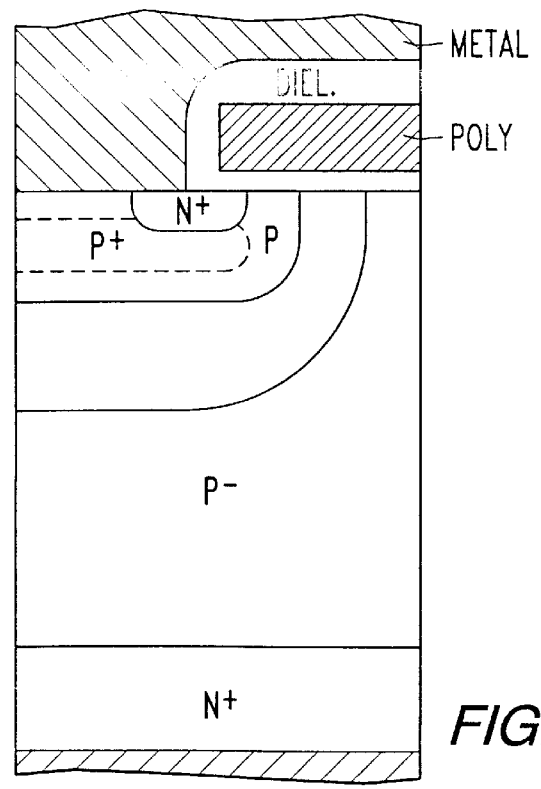
FIG. 3(c)

IMPLANT DEEP BODY (HIGH DOSE BORON, HIGH ENERGY)

SiPIP RESIST, COAT WITH RESIST, ALIGN SOURCE MASK, EXPOSE

DEVELOP RESIST    IMPLANT N+ SOURCE (HIGH DOSE ARSENIC)

METHOD OF MAKING A MOS-GATED SEMICONDUCTOR DEVICE WITH A SINGLE DIFFUSION

BACKGROUND OF THE INVENTION

The present invention relates to methods of fabricating MOS-gated semiconductor devices, and more particularly to such a method in which the number of diffusion steps is reduced from two to one.

Semiconductor devices are fabricated in multi-step processes in which each step is costly and time consuming. The need for each step is carefully analyzed and steps are eliminated or consolidated whenever possible. The cost and time saved by elimination of even a single step makes a process in which such an improvement is found a valuable asset.

By way of example, MOS-gated semiconductor devices are typically fabricated in steps which include: forming the wafer with junctions as will be needed beneath the gate structure, growing a gate oxide, depositing polycrystalline silicon (polysilicon) on the gate oxide, patterning and etching the polysilicon to form a gate electrode as well as a mask for channel and source dopants, implanting a P type dopant through openings in the polysilicon mask to form the channel region, forming a further mask for the P+ dopant which will form the body region, implanting the P+ dopant through the further mask, diffusing these dopants in a first diffusion operation, implanting the N+ source region dopant through the openings in the polysilicon mask, and then diffusing this dopant in a second diffusion operation. FIGS. 5(a)–5(c) respectively illustrate a MOSFET, IGBT and an MCT which may be made by such typical fabrication steps.

The present invention is directed, at least in part, to a method of consolidating the two diffusion operations in the above, although the method will find application in a variety of semiconductor device fabrication operations and is not limited to the process above.

Accordingly, it is an object of the present invention to provide a novel method of fabricating a semiconductor device in which the number of diffusion steps is reduced from two to one, thereby obviating the problems of the prior art.

It is another object of the present invention to provide a novel method of fabricating a semiconductor device in which a first conductivity type dopant is implanted through a mask opening to form a first layer, and a second conductivity type dopant is implanted through the opening to form a second layer deeper than the first layer, where the second conductivity type dopant has a faster diffusion rate than the first conductivity type dopant and a propensity to migrate into high concentrations of the first conductivity type dopant, and in which the first and second conductivity type dopants are diffused in a single diffusion operation.

It is yet another object of the present invention to provide a novel method of fabricating an MOS-gated semiconductor device in which arsenic is implanted to form a first layer, boron is implanted to form a second layer deeper than the first layer, and in which a single diffusion of the implanted arsenic and boron forms a P+ body region with an N+ source region therein and a P type channel region.

It is still another object of the present invention to provide a novel method of fabricating an MOS-gated semiconductor device in which a polysilicon gate forms a mask through which structures in the substrate are to be formed, arsenic is implanted at a first dose and a first energy level through the mask openings, boron is implanted at a second dose and a second energy level through the mask openings, and in which a single diffusion forms a structure with a P+ body region with a dopant concentration of from $1\times10^{18}/cm^3$ to $1\times10^{19}/cm^3$ beneath an N+ source region therein and a P type channel region with a dopant concentration of from $1\times10^{17}/cm^3$ to $5\times10^{17}/cm^3$.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIGS. 3(a)–3(c) illustrate three devices in which a further embodiment of the method of the present invention may be used.

DESCRIPTION OF PREFERRED EMBODIMENTS

Figure 1A:
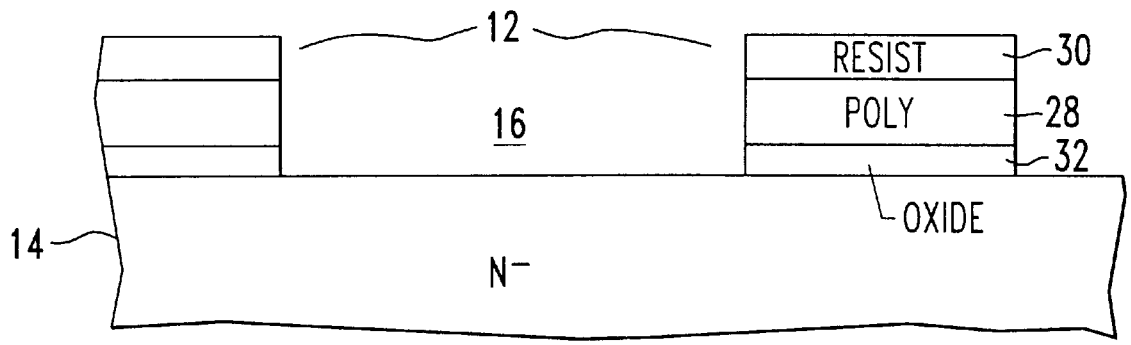
FIGS. 1(a)–1(c) illustrate the sequence of steps in an embodiment of the present invention.
Figure 1B:
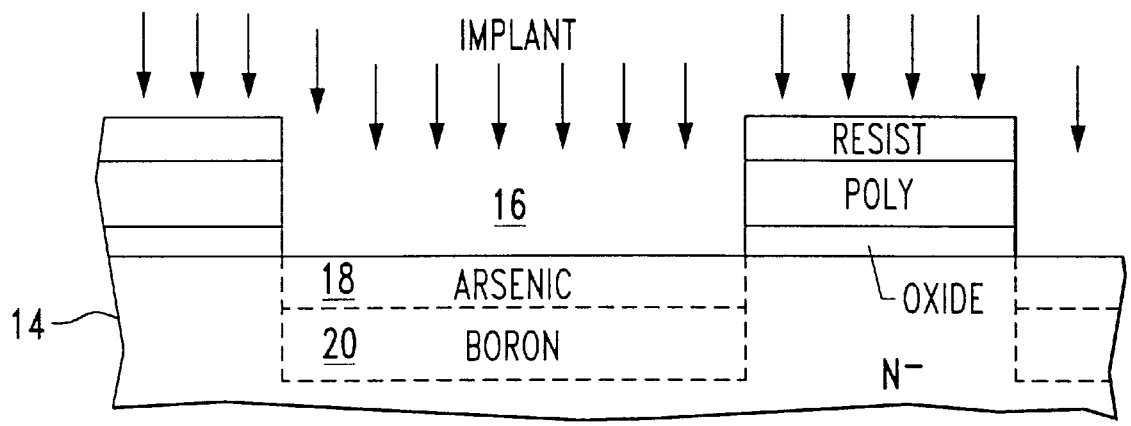
Figure 1C:
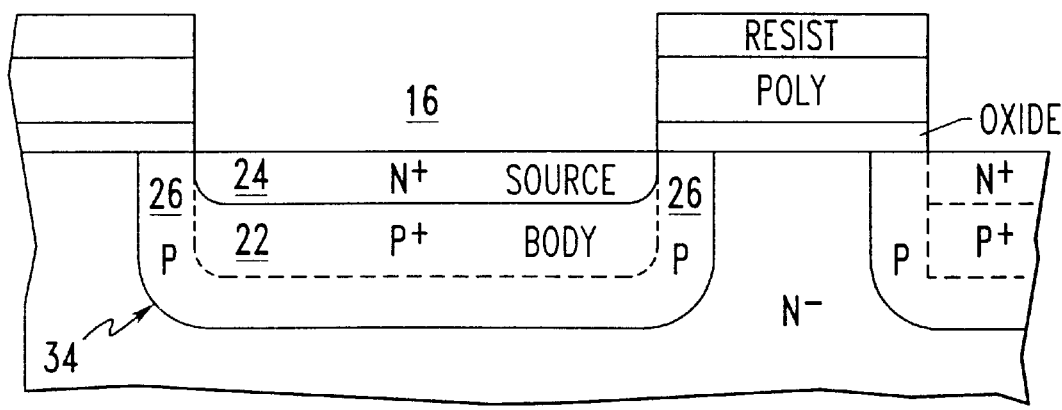

With reference now to FIGS. 1(a)–1(c), an embodiment of the method of fabricating a semiconductor device of the present invention may include (FIG. 1(a)) formatting a mask 12 on a surface of a semiconductor substrate 14, the mask having an opening 16 through which a structure in the substrate is to be formed, (FIG. 1(b)) implanting source dopant (preferably arsenic) through opening 16 to form a layer 18 with a high concentration of source dopant and implanting a body dopant (preferably boron) through opening 16 to form a layer 20 deeper than layer 18, and (FIG. 1(c)) diffusing, in a single diffusion, the implanted source dopant and the implanted body dopant to form a structure in substrate 14 having a P+ body region 22 with an N+ source region 24 therein and a P type channel region 26. The order of implant (source or body first) is not critical.

Mask 12 and opening 16 may be formed conventionally, and may include a gate polysilicon 28 (with or without a photoresist 30) on a gate oxide 32 (which may extend over opening 16, depending on the nature of the device and its fabrication process). Mask 12 may take various forms and its composition and method of formation is not significant to the present invention.

For an arsenic source dopant and a boron body dopant, the dose of the arsenic dopant is preferably about $1\times10^{15}/cm^2$ to $1\times10^{16}/cm^2$ (although other values may be used without departing from the spirit of the present invention), and the dose of the boron dopant may cover this same range. For a particular product a designer may choose a dose of a source dopant higher than the dope of the body dopant, or vice versa. For example, a designer may choose a very high source dose in order to minimize the series resistance, or a lighter source dose to provide some ballast resistance for a more uniform current distribution, or very high body dose to minimize bipolar effects, or a lighter body dose to maximize breakdown voltage.

The choice of implant energy may also cover a wide range. The body implant energy could be higher or lower than the source implant energy, as long as the body dopant ends up deeper than the source dopant. For example, if the source dopant is arsenic and the body dopant is boron, the higher atomic weight of the arsenic will cause the source to be shallower than the body, even if they implanted at about the same energy (such as 140 to 180 KeV), or even several times higher. The depths of the arsenic and boron layers may be determined for the device which is to be fabricated, and the dose, energy level and diffusion time and temperature may be adjusted to set the appropriate depths.

The single diffusing step replaces the two diffusion operations of the prior art. In the examples above, the diffusion operation may take place in a nitrogen atmosphere at about 110020 C. for about 25 minutes.

In a preferred embodiment, the result of the diffusion step in the example above is that P channel region 26 has a boron dopant concentration of from $1 \times 10^{17}/cm^3$ to $5 \times 10^{17}/cm^3$, and the P+ body region 22 beneath source region 24 has a dopant concentration of from $1 \times 10^{18}/cm^3$ to $1 \times 10^{19}/cm^3$. The preferred boron dopant concentration in channel region 26 provides the desired threshold voltage for a MOS gate. Similarly, the preferred boron dopant concentration in body region 22 reduces the gain of the vertical parasitic NPN bipolar transistor (including a N+ source region, a P+ body region, and a N− drain in substrate 14).

By way of further explanation, the boron dopant has a faster diffusion rate than the arsenic dopant and a propensity to migrate into high concentrations of the arsenic dopant rather than to regions where the arsenic dopant concentration is low. This relationship allows the relatively lower concentration of dopant in the channel region during the diffusion step. If channel region 26 were doped by upward diffusion of boron without the arsenic layer being present, the boron concentration would quickly exceed the desired value before there were enough lateral diffusion to form channel region 26. While channel region 26 could be formed in this way, it is likely that precise and costly control of deposition and diffusion would be required. The arsenic layer 18 absorbs a large amount of the upward moving boron, thereby facilitating the desired channel dopant concentration over a wider range of diffusion conditions (that is, less precision is needed so that costs may be reduced).

Note that boron and phosphorous do not have the relationship described above, and thus the combination of boron and phosphorous would not be a suitable alternative to the preferred boron and arsenic. Nevertheless, other combinations of two dopants with the desired properties may be used; that is, where the body dopant has a faster diffusion rate than the source dopant and the body dopant has a propensity to migrate into high concentrations of the source dopant.

Figure 2A:
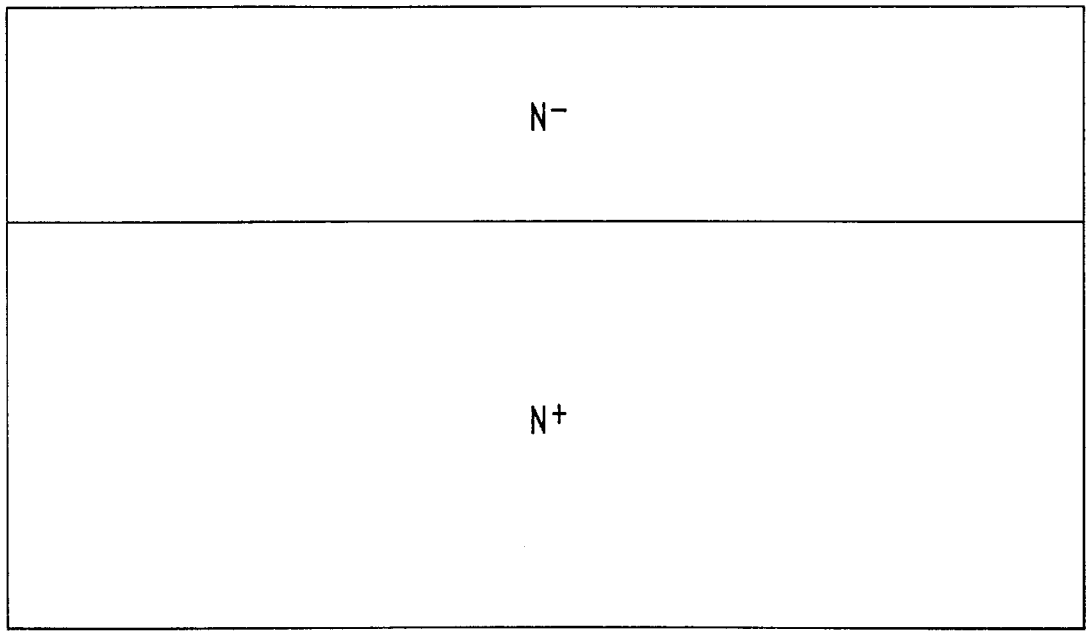
FIGS. 2(a)–2(s) provide a more detailed illustration of the sequence of steps in the embodiment of FIGS. 1(a)–(c).
Figure 2B:
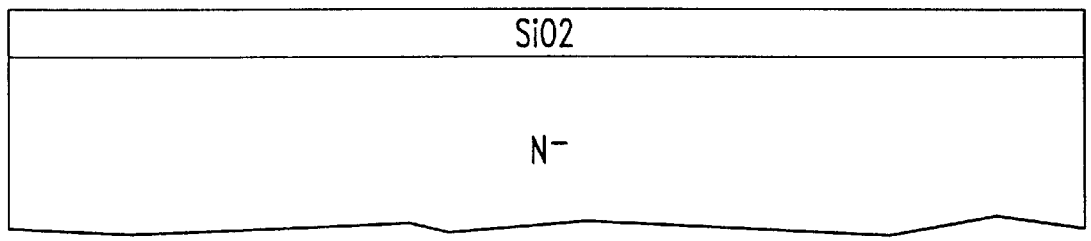
Figure 2C:
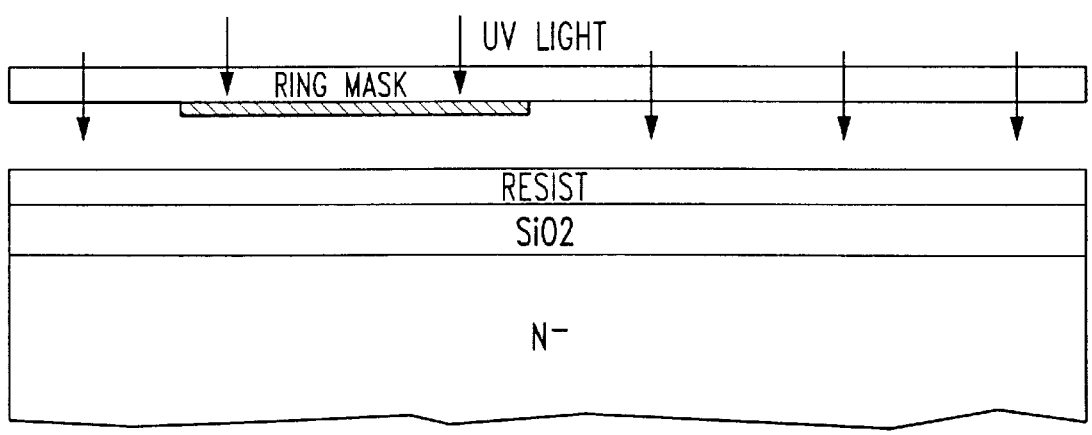
Figure 2D:
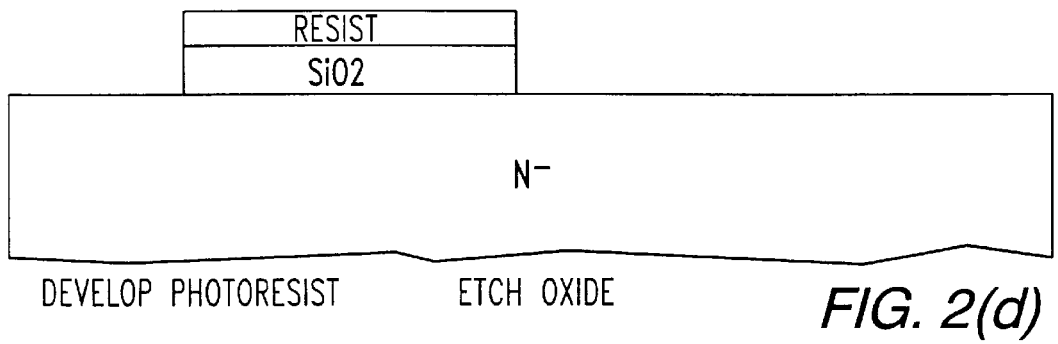
Figure 2E:
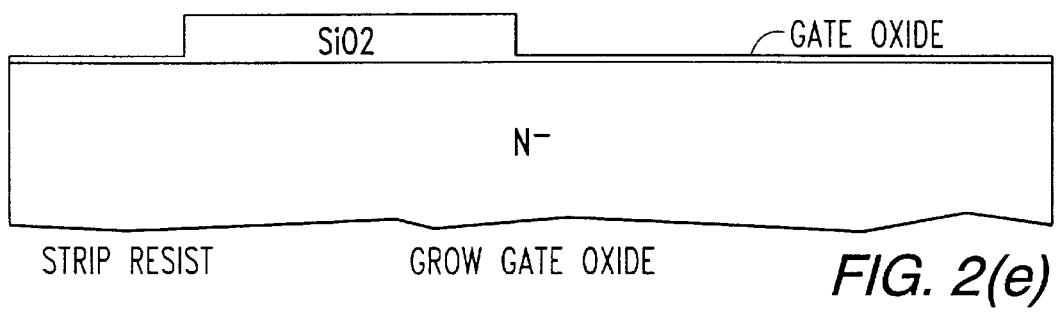
Figure 2F:
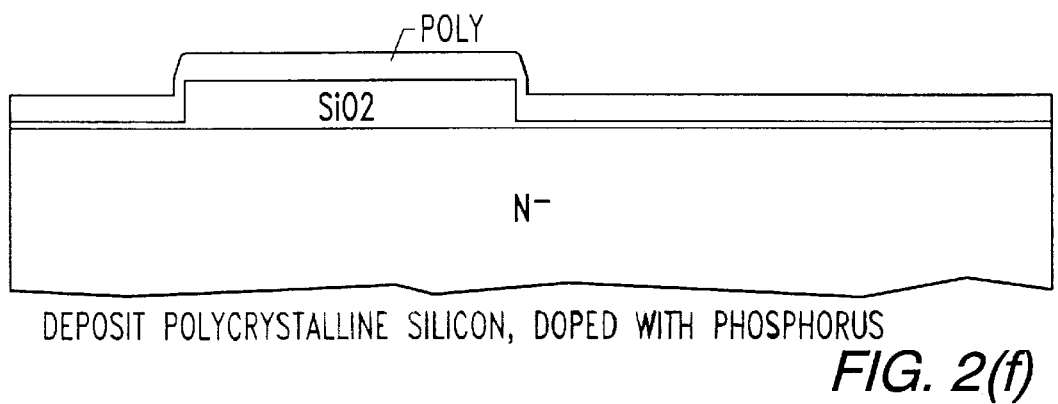
Figure 2G:
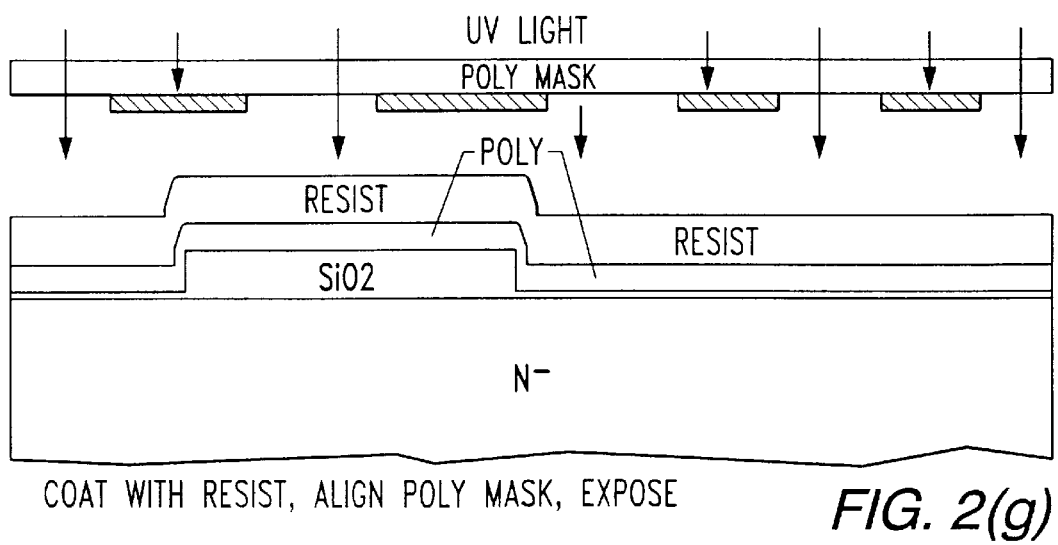
Figure 2L:
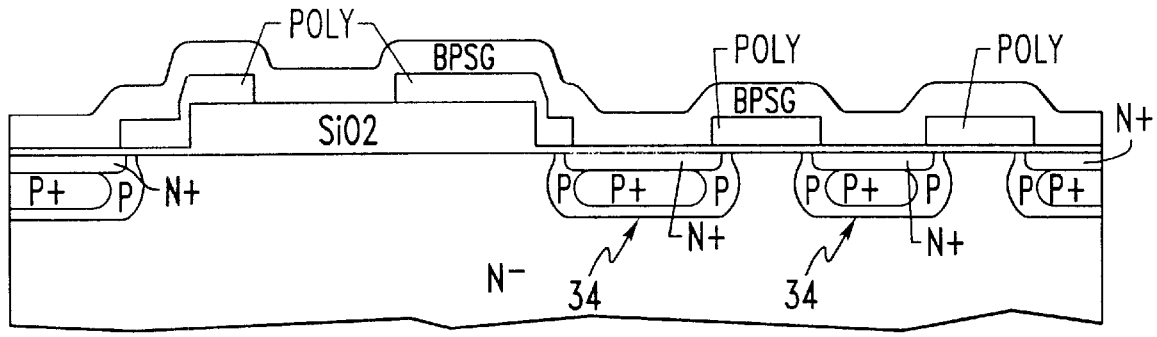
Figure 2M:
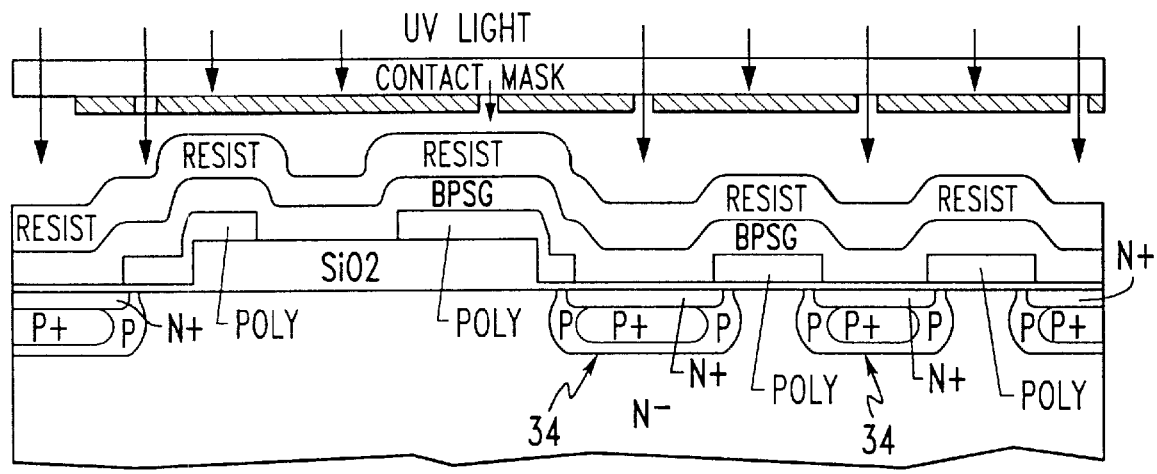
Figure 2N:
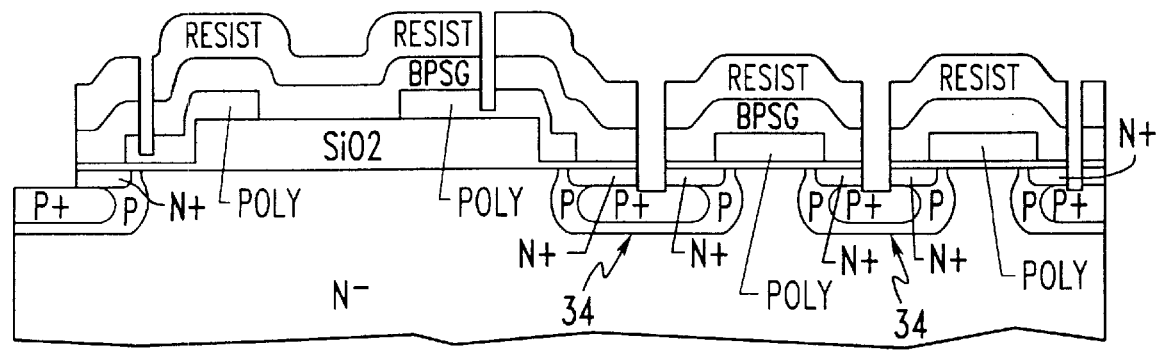
Figure 2O:
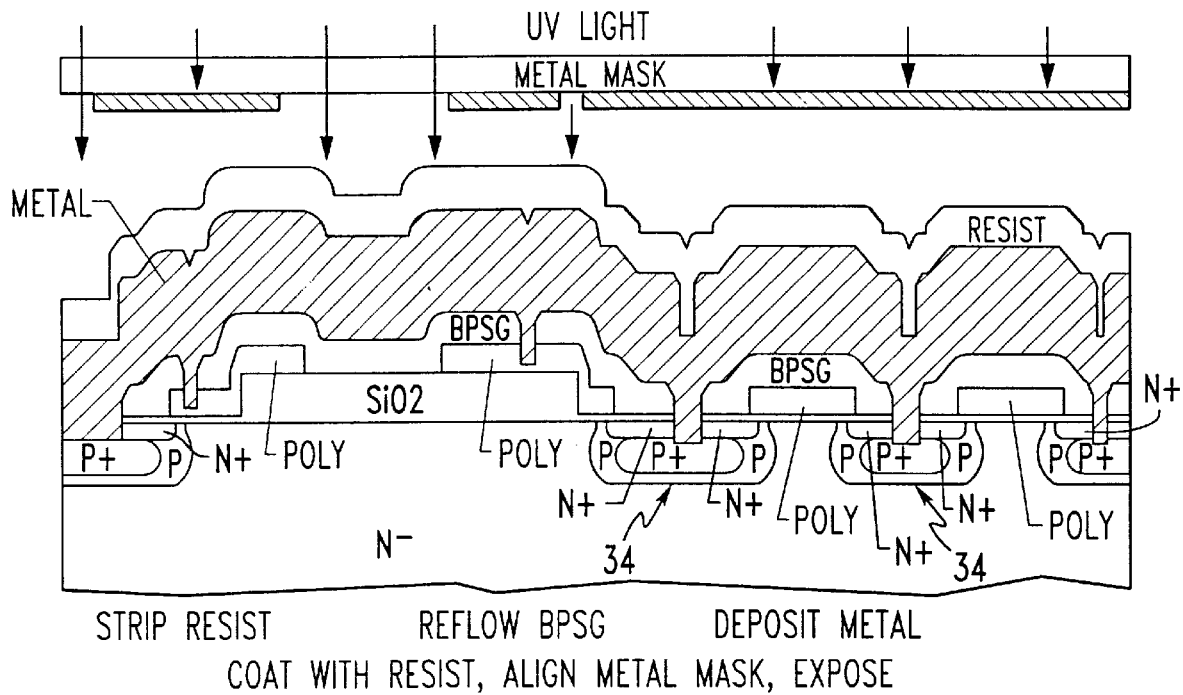
Figure 2P:
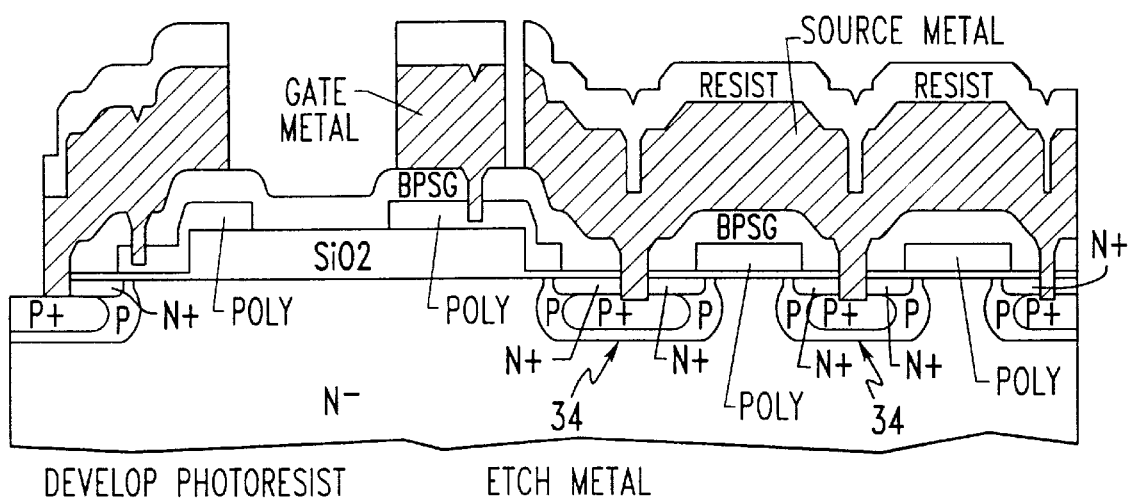
Figure 2Q:
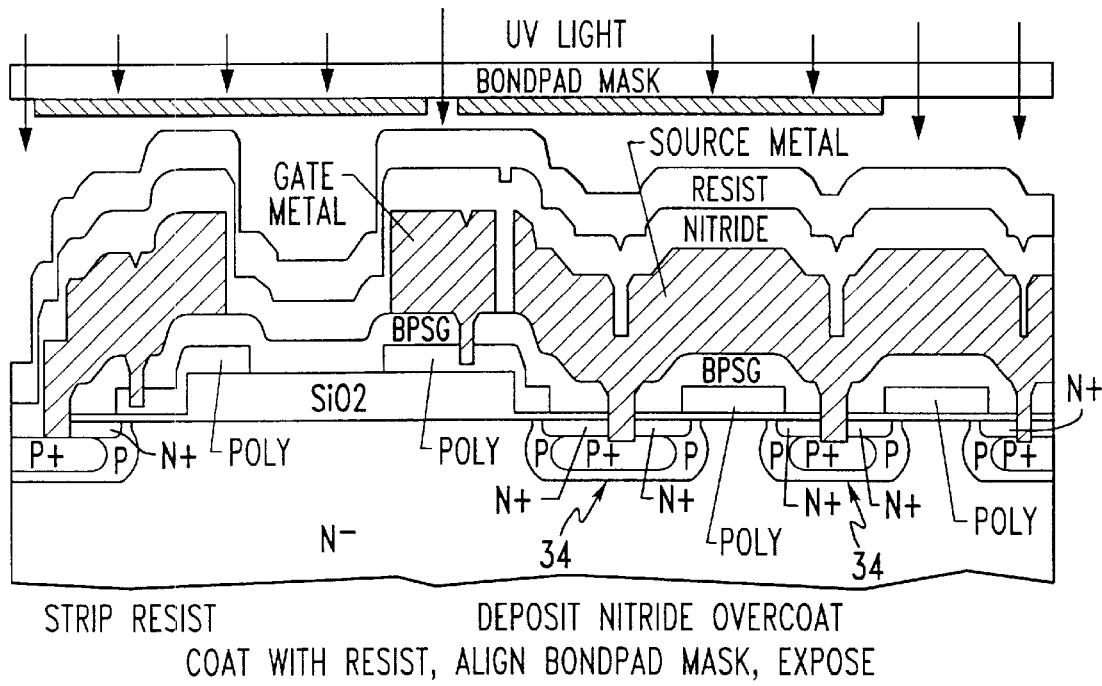
Figure 2R:
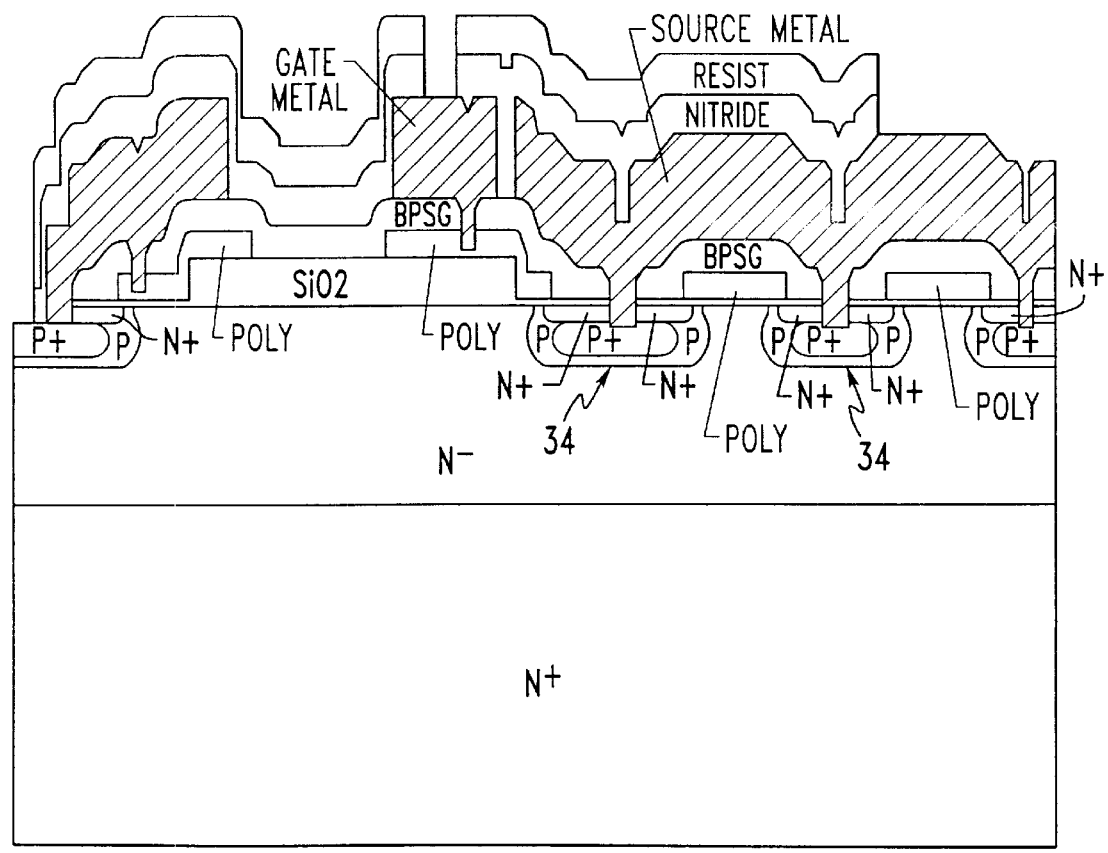
Figure 2S:
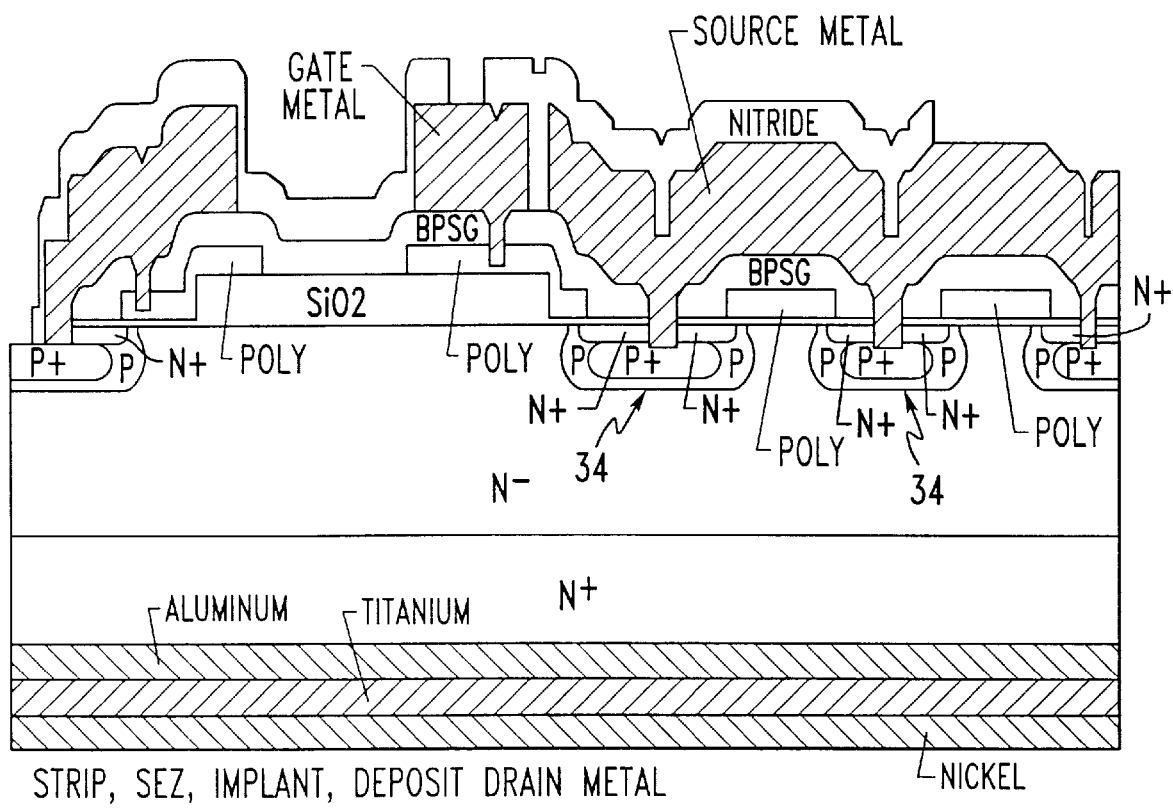

An understanding of the steps shown in FIGS. 1(a)–1(c) may be facilitated with reference to FIGS. 2(a)–2(s) which show a more detailed sequence of steps which may be used in practicing an embodiment of the invention. FIGS. 2(a)–2(s) include explanatory text of descriptive legends, which obviates the need for further explanation herein. Note that FIG. 2(k) corresponds generally to FIG. 1(c) in that the N+ source region covers the entire P+ body region. The N+ source region may then be etched from the central portion to provide a body contact region (i.e., where the source metal contacts the P+ body region between the N+ source regions in FIG. 2(o)) by use of a photomask, as shown in FIGS. 2(m) through 2(n). Metalization may follow the steps shown in the subsequent figures.

Figure 4H:
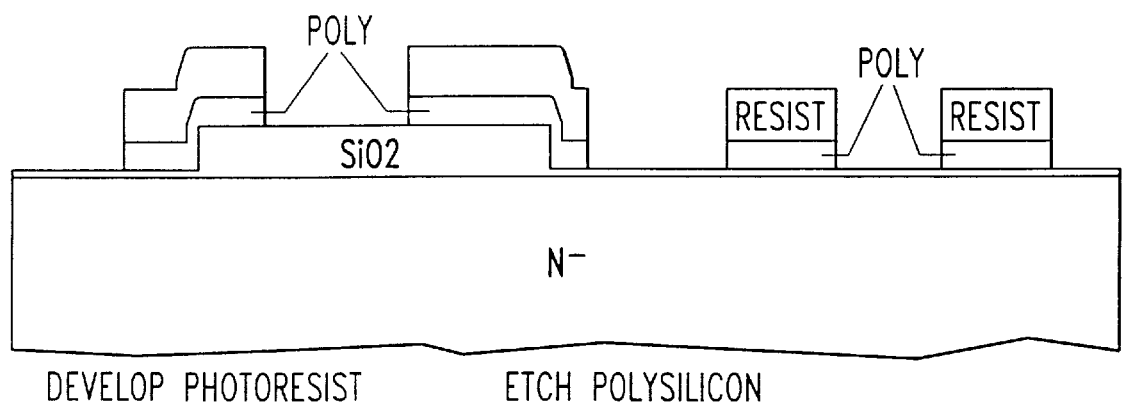
FIGS. 4(h)–4(t) provide a more detailed illustration of the sequence of steps in the embodiment of FIG. 3(a).
Figure 4I:
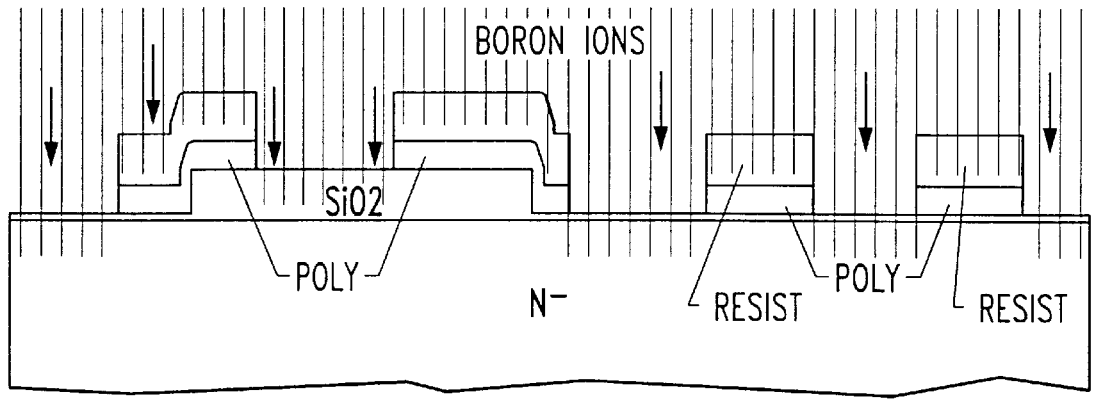
Figure 4J:
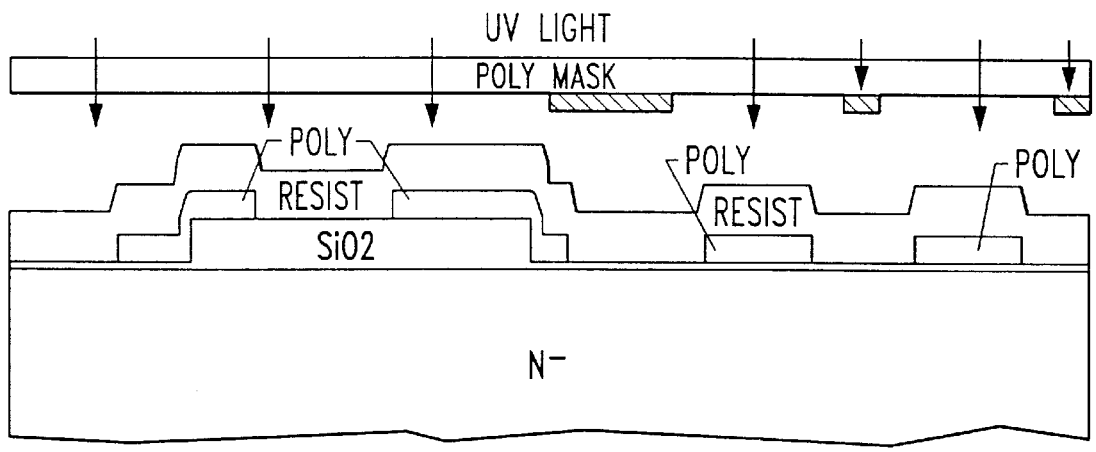
Figure 4K:
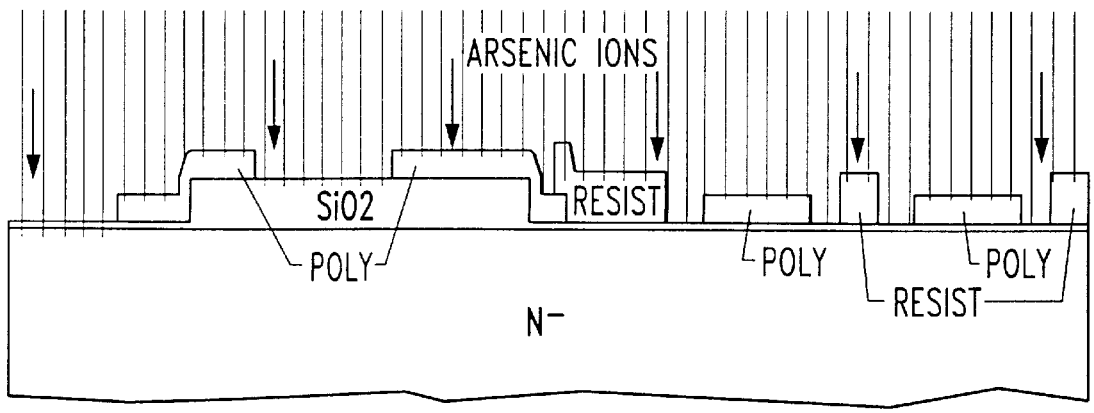
Figure 4L:
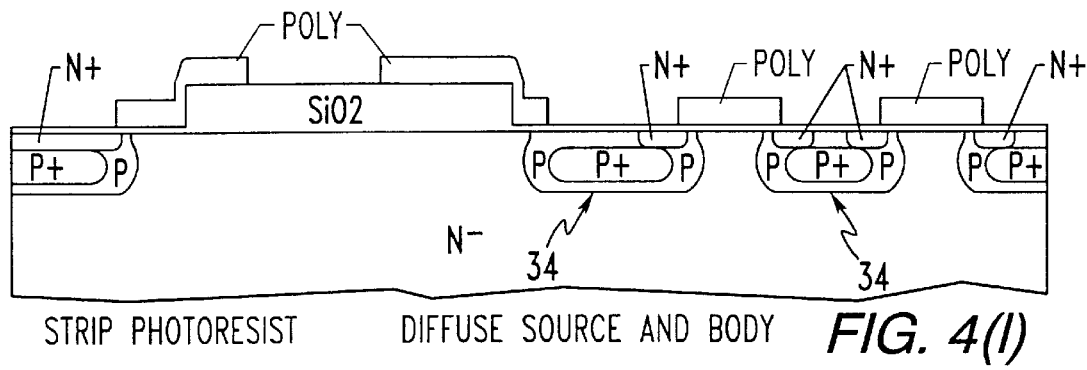
Figure 4M:
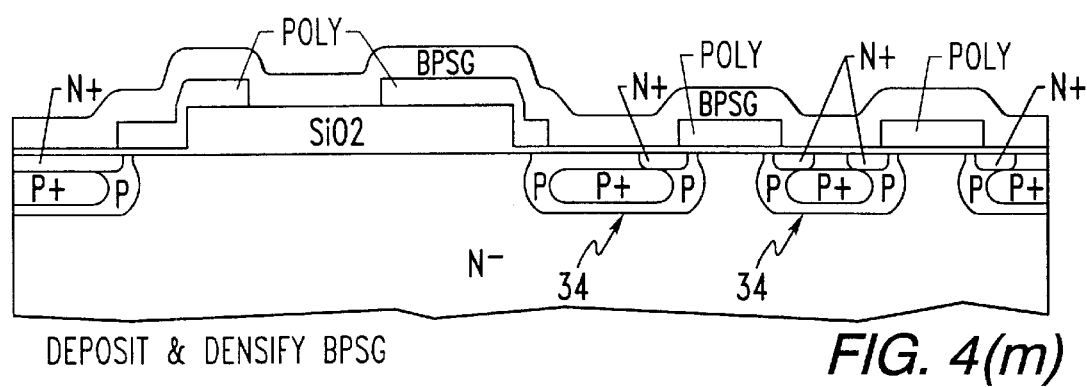
Figure 4N:
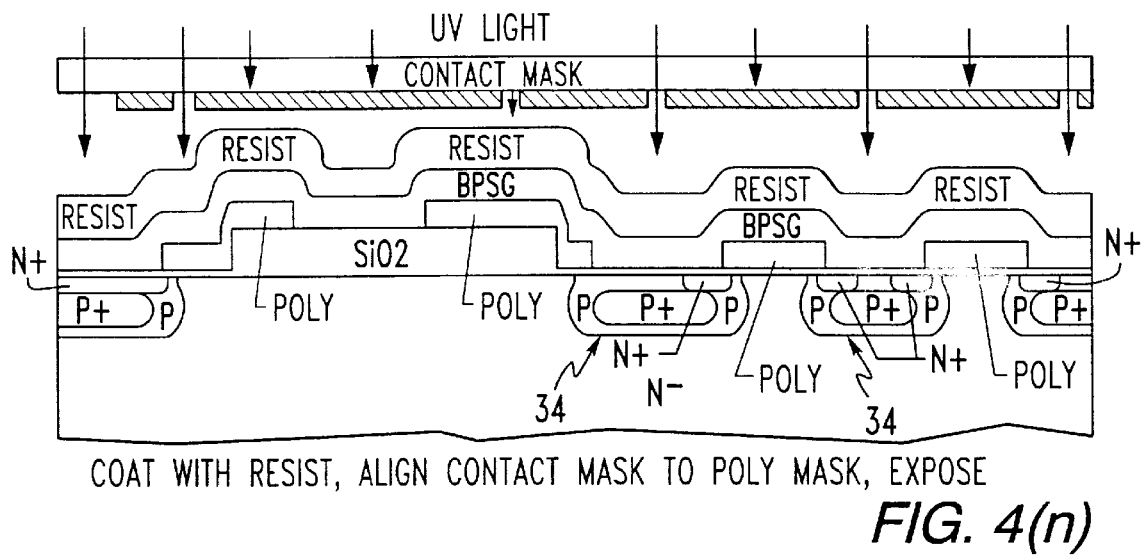
Figure 4O:
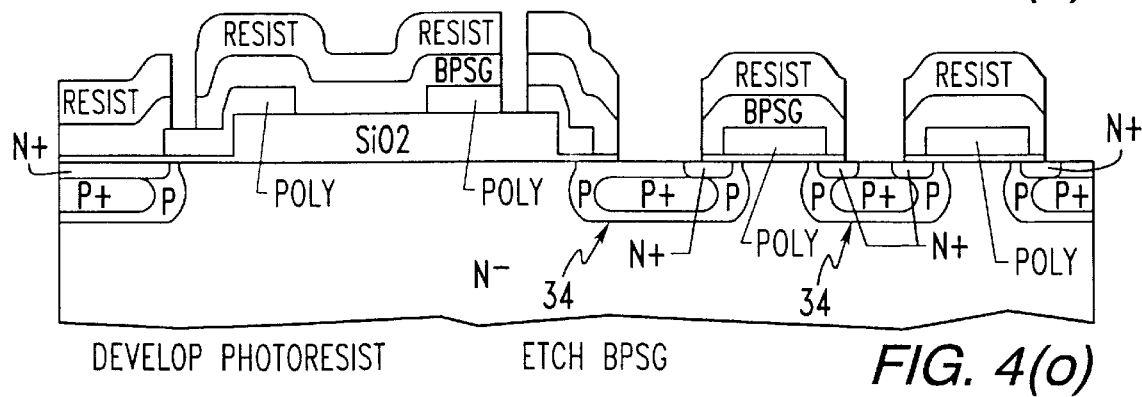
Figure 4P:
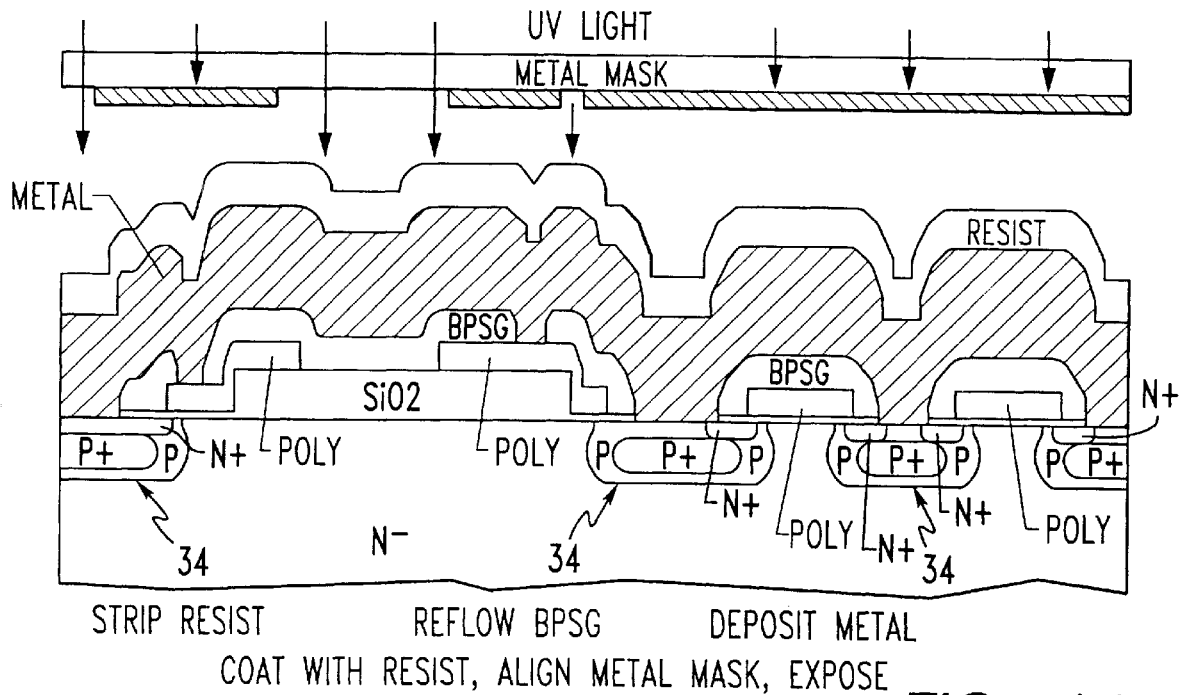
Figure 4Q:
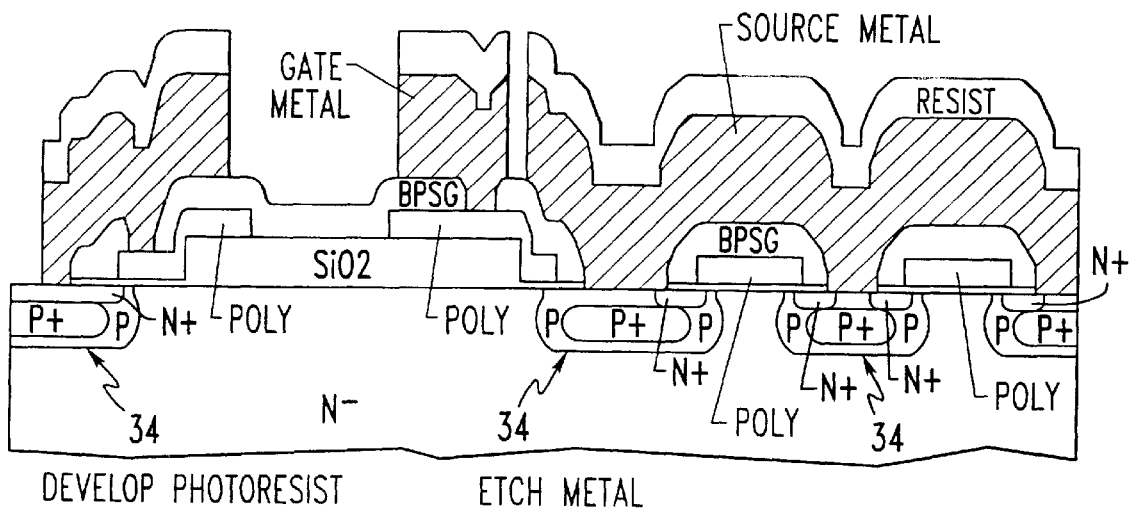
Figure 4R:
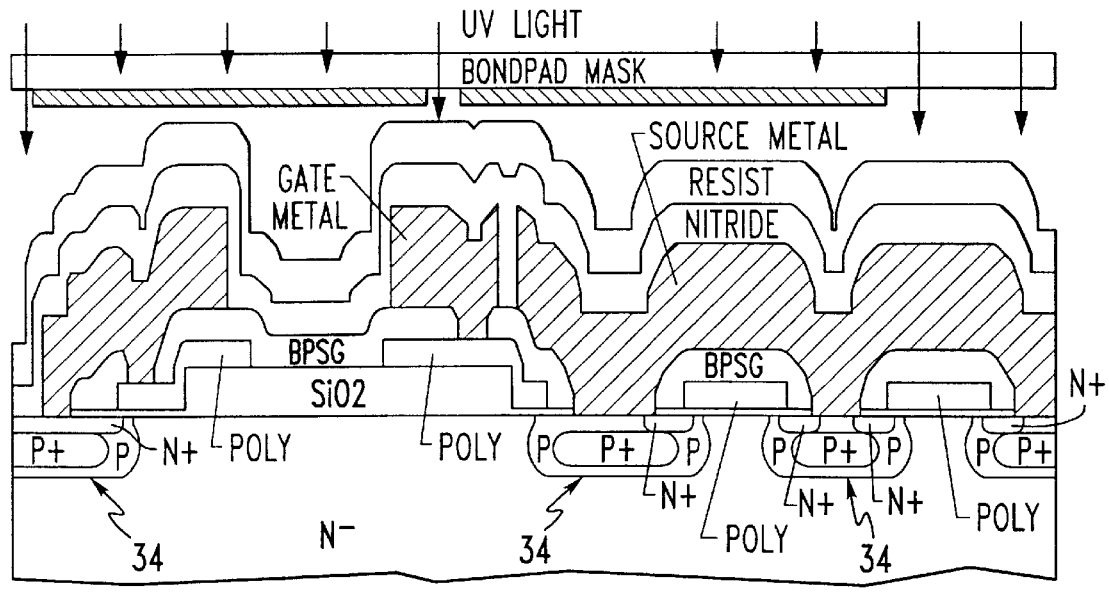
Figure 4S:
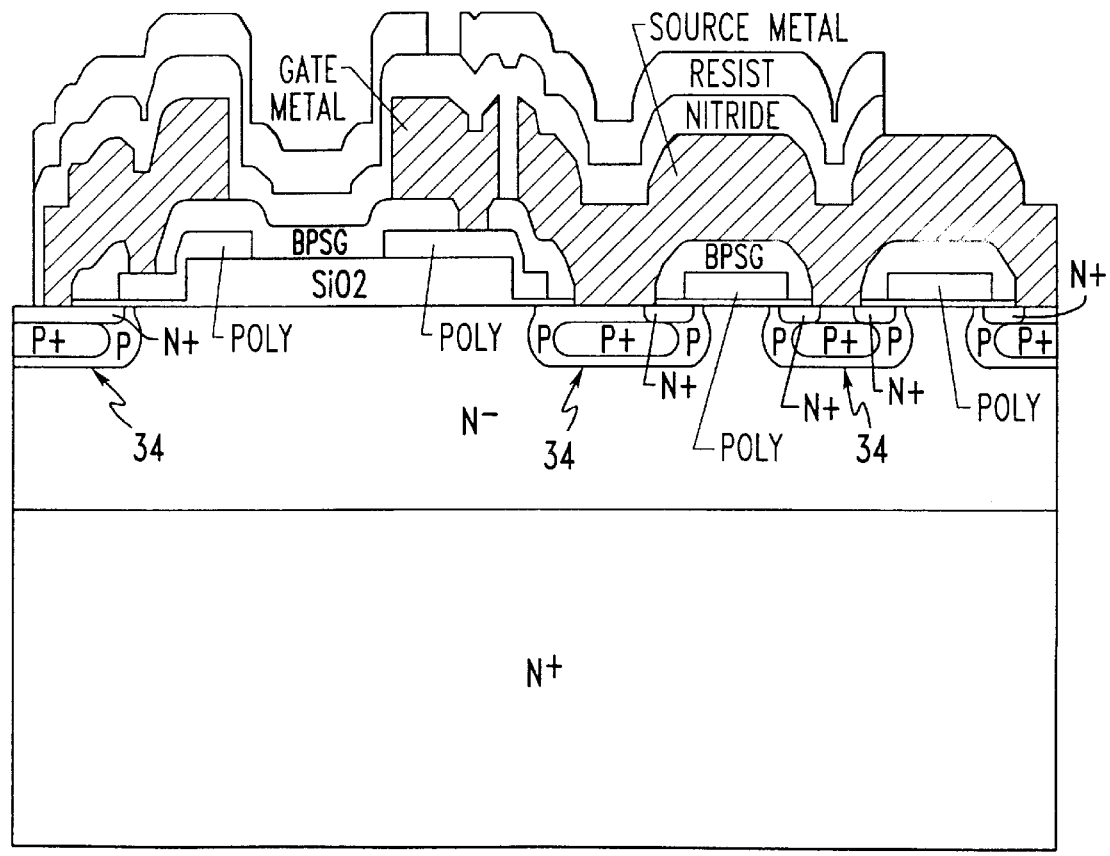
Figure 4T:
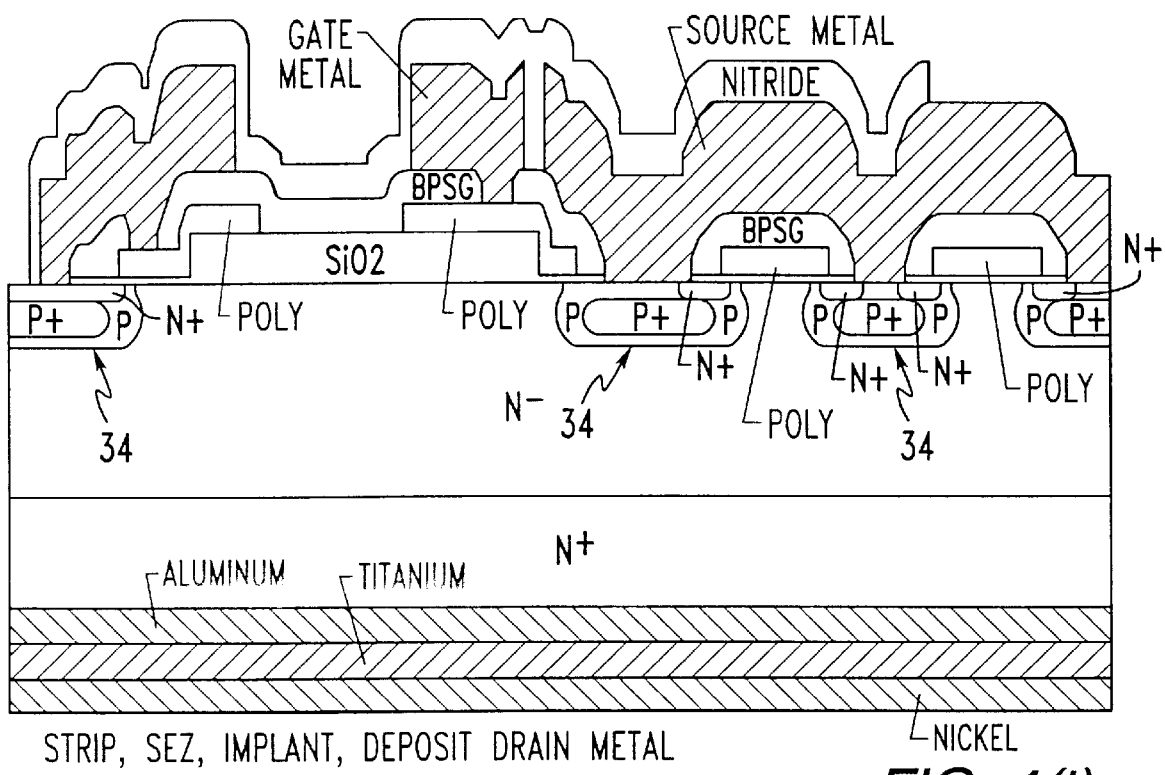
Figure 5A:
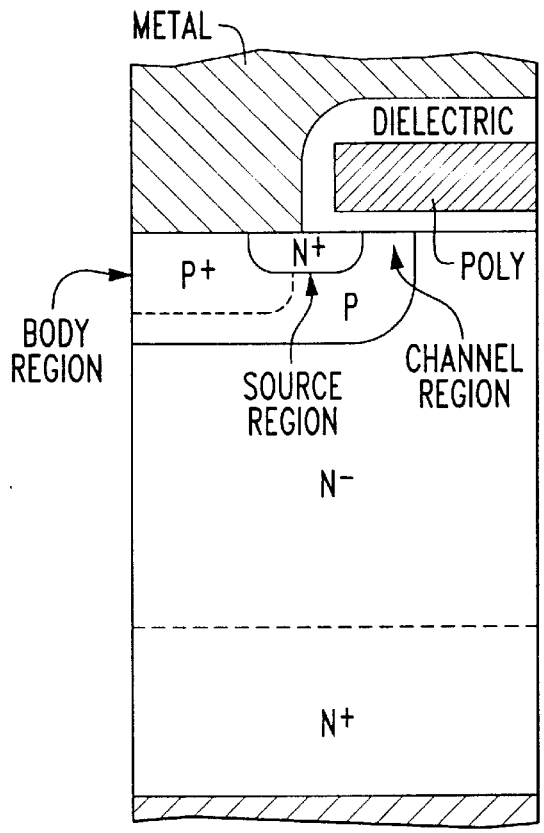
FIGS. 5(a)–5(c) illustrate examples of known MOS-gated semiconductor devices.
Figure 5B:
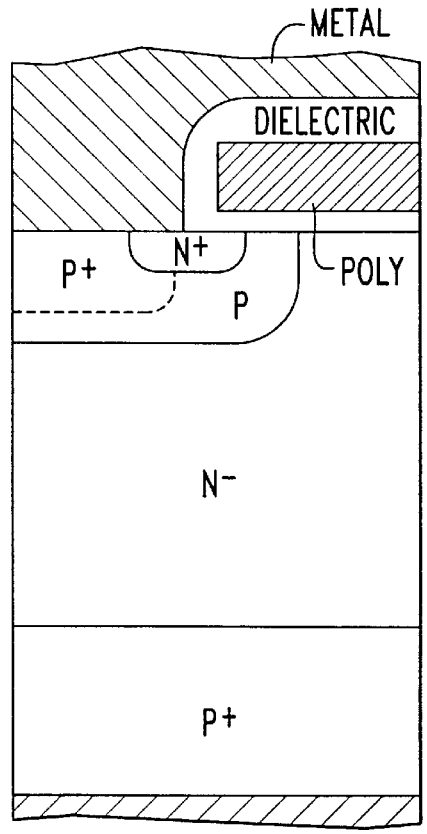
Figure 5C:
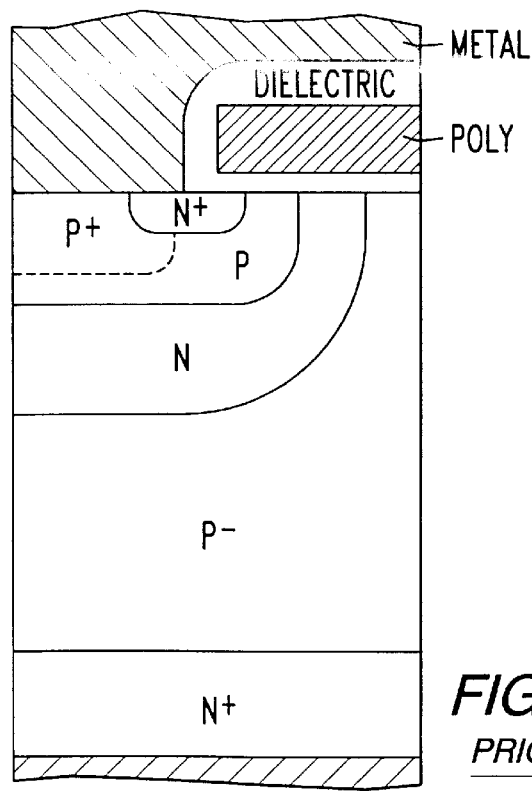

In a further embodiment of the present invention, a photomask may be applied prior to the N+ source dopant implant so that this implant is excluded from the central portion, thus avoiding a subsequent etch (that is, avoiding the etch described above and FIGS. 2(m) through 2(n)). For example, as illustrated in FIGS. 3(a)–3(c), a body contact region has been formed where the overlying source metal makes ohmic electrical contact to the P type body region. The body contact region may be implanted with a P type dopant (P or P+, for example), either at the same time as the P+ body dopant is implanted or in a separate implant operation. The dopant may be implanted with a photomask which restricts it to the body contact region area or may be implanted without a mask, in which event it is implanted into the N+ source region as well as into the body contact region. If the dopant is implanted without a mask the P type dose should be low enough so that it does not overdope the N+ source region. An understanding of this embodiment may be facilitated with reference to FIGS. 4(h)–4(t), which show a more detailed sequence of steps which may be used in practicing this embodiment, with explanatory text of descriptive legends. The steps of FIGS. 2(a)–2(g) are repeated and the steps in this embodiment begin with FIG. 4(h). The extra masking for forming the body contact region that is applied prior to the N+ source dopant implant is shown in FIG. 4(j). Note that FIG. 4(p) corresponds generally to FIG. 3(a) in that the body contact region is formed between N+ source regions.

While FIGS. 1(a)–1(c) illustrate forming a single cellular region 34, including source region 24, body region 22 and channel region 26, a plurality of such cellular regions 34 may be formed in a semiconductor substrate 14 for one or more semiconductor devices, such as illustrated in FIGS. 2(k)–2(s) and FIGS. 4(l)–4(t), for example.

The present invention may be used to fabricate a variety of semiconductor devices, such as MOS-gated semiconductor devices, including the MOSFET, IGBT and MCT shown in FIGS. 3(a)–3(c).

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of fabricating a MOS-gated semiconductor device, comprising the steps of:

forming a mask on a surface of a semiconductor substrate, the mask having at least one opening through which a corresponding source region, a corresponding body region, and a corresponding channel region are to be formed for at least one said MOS-gated semiconductor device;

implanting a first conductivity type dopant at a first dose and a first energy level through the at least one opening to form a first layer;

implanting a second conductivity type dopant at a second dose and a second energy level through the at least one opening to form a second layer deeper than the first layer, the second conductivity type dopant having a faster diffusion rate than the first conductivity type dopant and a propensity to migrate into high concentrations of the first conductivity type dopant; and diffusing, in a single diffusion, the implanted first and second conductivity type dopants to form in the semiconductor substrate at least one said body region having a second conductivity type, at least one said source region having a first conductivity type, and at least one said channel region having a second conductivity type and a lower dopant concentration than a dopant concentration of said body region.

2. The method of claim 1, wherein the step of implanting the second conductivity type dopant precedes the step of implanting the first conductivity type dopant.

3. The method of claim 1, wherein the step of implanting the first conductivity type dopant precedes the step of implanting the second conductivity type dopant.

4. The method of claim 1, wherein the first conductivity type dopant is arsenic and the second conductivity type dopant is boron.

5. The method of claim 1, further comprising the step of: etching a central portion of at least one said first conductivity type source region to provide a corresponding body contact region.

6. The method of claim 1, wherein the step of implanting the second conductivity type dopant precedes the step of implanting the first conductivity type dopant, and further comprising the step of masking a central portion of at least one area of the semiconductor substrate where a corresponding said first conductivity type source region is to be formed after implanting the second conductivity type dopant and before implanting the first conductivity type dopant to provide a corresponding body contact region.

7. The method of claim 1, wherein at least one cellular region for at least one said MOS-gated semiconductor device is formed in the semiconductor substrate, each cellular region comprising a said source region, a said body region, and a said channel region.

8. The method of claim 7, wherein a plurality of cellular regions are formed in the semiconductor substrate.

9. A method of fabricating a semiconductor device, comprising the steps of:
providing a mask on a surface of a semiconductor substrate for forming in the semiconductor substrate at least one said semiconductor device;
implanting arsenic dopant through at least one opening in the mask to form a first layer;
implanting boron dopant through the at least one opening to form a second layer, deeper than the first layer; and
diffusing, in a single diffusion, the implanted arsenic and the implanted boron to form in the semiconductor substrate at least one P+ body region, at least one N+ source region, and at least one P type channel region for at least one said semiconductor device.

10. The method of claim 9, wherein the diffusing step is at about 1100° C. for about 25 minutes.

11. The method of claim 9, wherein the at least one P type channel region has a dopant concentration of from $10 \times 10^{17}/cm^3$ to $5 \times 10^{17}/cm^3$.

12. The method of claim 11, wherein a portion of the at least one P+ body region beneath a corresponding N+ source region has a dopant concentration of from $1 \times 10^{18}/cm^3$ to $1 \times 10^{19}/cm^3$.

13. The method of claim 9, wherein the at least one semiconductor device is one of: a MOSFET, an IGBT and a MCT.

14. The method of claim 9, wherein dosages of the arsenic dopant and the boron dopant are both from $1 \times 10^{15}/cm^2$ to $1 \times 10^{16}/cm^2$.

15. The method of claim 9, wherein energy levels for implanting the arsenic dopant and the boron dopant are both from 140 KeV to 180 KeV.

16. The method of claim 9, further comprising the step of: etching a central portion of at least one N+ source region to provide a corresponding P+ body contact region.

17. The method of claim 9, wherein the step of implanting the boron dopant precedes the step of implanting the arsenic dopant, and further comprising the step of masking a central portion of at least one area of the semiconductor substrate where a corresponding N+ source region is to be formed after implanting the boron dopant and before implanting the arsenic dopant to provide a corresponding P+ body contact region.

18. The method of claim 9, wherein the step of implanting the boron dopant precedes the step of implanting the arsenic dopant, and further comprising the step of masking a central portion of at least one area of the semiconductor substrate where a corresponding N+ source region is to be formed after implanting the boron dopant and before implanting the arsenic dopant to provide a corresponding P type body contact region.

19. The method of claim 9, wherein at least one cellular region for at least one said semiconductor device is formed, each cellular region comprising a N+ source region, a P+ body region, and a P type channel region.

20. The method of claim 19, wherein a plurality of cellular regions are formed in the semiconductor substrate.

21. A method of fabricating a MOS-gated semiconductor device, comprising the steps of:
forming a mask on a surface of a semiconductor substrate, the mask having at least one opening through which a corresponding source region, a corresponding body region, and a corresponding channel region are to be formed for at least one said MOS-gated semiconductor device;
implanting a first conductivity type dopant at a first dose and a first energy level through the at least one opening to form a first layer;
implanting a second conductivity type dopant at a second dose and a second energy level through the at least one opening to form a second layer deeper than the first layer, wherein the first layer is formed prior to the second layer and the second conductivity type dopant has a faster diffusion rate than the first conductivity type dopant and a propensity to migrate into high concentrations of the first conductivity type dopant; and
diffusing, in a single diffusion, the implanted first and second conductivity type dopants to form in the semiconductor substrate at least one said body region having a second conductivity type, at least one said source region having a first conductivity type, and at least one said channel region having a second conductivity type and a lower dopant concentration than a dopant concentration of said body region.

22. A method of fabricating a MOS-gated semiconductor device, comprising the steps of:
forming a mask on a surface of a semiconductor substrate, the mask having at least one opening through which a corresponding source region, a corresponding body region, and a corresponding channel region are to be formed for at least one said MOS-gated semiconductor device;
implanting a first conductivity type dopant at a first dose and a first energy level through the at least one opening to form a first layer;
implanting a second conductivity type dopant at a second dose and a second energy level through the at least one opening to form a second layer deeper than the first layer, the second conductivity type dopant having a faster diffusion rate than the first conductivity type dopant and a propensity to migrate into high concentrations of the first conductivity type dopant;

diffusing, in a single diffusion, the implanted first and second conductivity type dopants to form in the semiconductor substrate at least one said body region having a second conductivity type, at least one said source region having a first conductivity type, and at least one said channel region having a second conductivity type and a lower dopant concentration than a dopant concentration of said body region; and etching a central portion of at least one said first conductivity type source region to provide a corresponding body contact region.

23. A method of fabricating a semiconductor device, comprising the steps of:

providing a mask on a surface of a semiconductor substrate for forming in the semiconductor substrate at least one said semiconductor device;

implanting arsenic dopant through at least one opening in the mask to form a first layer;

implanting boron dopant through the at least one opening to form a second layer, deeper than the first layer; and diffusing, in a single diffusion, the implanted arsenic and the implanted boron to form in the semiconductor substrate at least one P+ body region, at least one N+ source region, and at least one P type channel region for at least one said semiconductor device; and etching a central portion of at least one N+ source region to provide a corresponding P+ body contact region.

24. A method of fabricating a MOS-gated semiconductor device, comprising the steps of:

(a) forming a mask on a surface of a semiconductor substrate;

(b) implanting a first conductivity type dopant through an opening in the mask to form a first layer;

(c) implanting a second conductivity type dopant through the opening and the first layer to form a second layer underlying the first layer, wherein the second layer is implanted after the first layer; and (d) diffusing, in a single diffusion, the first and second layers to form in the semiconductor substrate a body region having a second conductivity type, a source region having a first conductivity type, and a channel region having a second conductivity type and a lower dopant concentration than a dopant concentration of the body region to thereby form a cellular region for the MOS-gated semiconductor device.

25. The method of claim 24, wherein the first conductivity type dopant is arsenic and the second conductivity type dopant is boron.

26. The method of claim 24, wherein said method forms a plurality of cellular regions in the semiconductor substrate.

27. The method of claim 24, wherein said method further comprises the step of etching the source region to provide a body contact region.

28. A method of fabricating a MOS-gated semiconductor device, comprising the steps of:

(a) forming a mask on a surface of a semiconductor substrate;

(b) implanting a first conductivity type dopant through an opening in the mask to form a first layer;

(c) implanting a second conductivity type dopant through the opening to form a second layer underlying the first layer; and (d) diffusing, in a single diffusion, the first and second layers to form a body region having a second conductivity type, a source region having a first conductivity type, and a channel region having a second conductivity type to thereby form a cellular region for the MOS-gated semiconductor device (e) etching the source region to provide a body contact region.

29. The method of claim 28, wherein the step of implanting the first conductivity type dopant precedes the step of implanting the second conductivity type dopant.

30. The method of claim 28, wherein the first conductivity type dopant is arsenic and the second conductivity type dopant is boron.

31. The method of claim 28, wherein said method forms a plurality of cellular regions in the semiconductor substrate.

32. A method of fabricating a semiconductor device, comprising the steps of:

(a) providing a mask on a surface of a semiconductor substrate for forming the semiconductor device in the substrate;

(b) implanting arsenic dopant through an opening in the mask to form a first layer;

(c) implanting boron dopant through the opening to form a second layer, underlying the first layer; and (d) diffusing, in a single diffusion, the implanted arsenic and the implanted boron to form a P+ body region, a N+ source region, and a P type channel region to thereby form the semiconductor device; and (e) etching a central portion of the N+ source region to provide a corresponding P+ body contact region.

33. The method of claim 32, wherein the diffusing step is at about 1100° C. for about 25 minutes.

34. The method of claim 32, wherein the P type channel region has a dopant concentration of from $1 \times 10^{17}/cm^3$ to $5 \times 10^{17}/cm^3$.

35. The method of claim 32, wherein a portion of the P+ body region beneath a corresponding N+ source region has a dopant concentration of from $1 \times 10^{18}/cm^3$ to $1 \times 10^{19}/cm^3$.

36. The method of claim 32, wherein the semiconductor device is one of: a MOSFET, an IGBT and a MCT.

37. The method of claim 32, wherein dosages of the arsenic dopant and the boron dopant are both from $1 \times 10^{15}/cm^2$ to $1 \times 10^{16}/cm^2$.

38. The method of claim 32, wherein energy levels for implanting the arsenic dopant and the boron dopant are both from 140 KeV to 180 KeV.

39. A method of fabricating a semiconductor device, comprising the steps of:

(a) providing a mask on a surface of a semiconductor substrate for forming the semiconductor device in the substrate;

(b) implanting arsenic dopant through an opening in the mask to form a first layer;

(c) implanting boron dopant through the opening and the first layer to form a second layer, deeper than the first layer; and (d) diffusing, in a single diffusion, the implanted arsenic and the implanted boron to form in the semiconductor substrate a P+ body region, a N+ source region, and a P type channel region to thereby form the semiconductor device.

40. The method of claim 39, further comprising the step of etching a central portion of the N+ source region to provide a corresponding P+ body contact region.

41. The method of claim 39, wherein the diffusing step is at about 1100° C. for about 25 minutes.

42. The method of claim 39, wherein the P type channel region has a dopant concentration of from $1\times10^{17}/cm^3$ to $5\times10^{17}/cm^3$.

43. The method of claim 39, wherein a portion of the P+ body region beneath a corresponding N+ source region has a dopant concentration of from $1\times10^{18}/cm^3$ to $1\times10^{19}/cm^3$.

44. The method of claim 39, wherein the semiconductor device is one of: a MOSFET, an IGBT and a MCT.

45. The method of claim 39, wherein dosages of the arsenic dopant and the boron dopant are both from $1\times10^{15}/cm^2$ to $1\times10^{16}/cm^2$.

46. The method of claim 39, wherein energy levels for implanting the arsenic dopant and the boron dopant are both from 140 KeV to 180 KeV.

* * * * *

UNITED STATES PATENT AND TRADEMARK OFFICE
CERTIFICATE OF CORRECTION

PATENT NO. : 6,080,614
DATED : June 27, 2000
INVENTOR(S) : Neilson, et. al.

It is certified that error appears in the above-identified patent and that said Letters Patent is hereby corrected as shown below:

Name of Assignee:
  Intersil Corporation

Residence:
  Palm Bay, Florida

Signed and Sealed this

Twenty-second Day of May, 2001

*Attest:*

NICHOLAS P. GODICI

*Attesting Officer*   *Acting Director of the United States Patent and Trademark Office*